United States Patent
Chen et al.

(10) Patent No.: US 7,534,662 B2
(45) Date of Patent: May 19, 2009

(54) METHODS FOR HERMETIC SEALING OF POST MEDIA-FILLED MEMS PACKAGE

(75) Inventors: Chien-Hua Chen, Corvallis, OR (US); Charles C. Haluzak, Corvallis, OR (US); Donald Michael, Monmoth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/127,915

(22) Filed: May 11, 2005

(65) Prior Publication Data

US 2005/0202591 A1  Sep. 15, 2005

Related U.S. Application Data

(62) Division of application No. 10/783,849, filed on Feb. 19, 2004, now Pat. No. 6,946,728.

(51) Int. Cl.
*H01L 21/00* (2006.01)
*H01L 23/22* (2006.01)

(52) U.S. Cl. .......... 438/126; 257/687; 257/E23.098

(58) Field of Classification Search .......... 438/126; 257/684, E23.098
See application file for complete search history.

(56) References Cited

U.S. PATENT DOCUMENTS

| | | | | |
|---|---|---|---|---|
| 4,357,557 A | * | 11/1982 | Inohara et al. | 313/509 |
| 4,611,385 A | * | 9/1986 | Forrest et al. | 438/16 |
| 4,810,931 A | * | 3/1989 | McKenna et al. | 313/509 |
| 4,849,071 A | * | 7/1989 | Evans et al. | 438/53 |
| 5,445,991 A | * | 8/1995 | Lee | 216/2 |
| 5,578,869 A | | 11/1996 | Hoffman et al. | |
| 5,596,486 A | | 1/1997 | Young et al. | |
| 5,723,904 A | * | 3/1998 | Shiga | 257/698 |
| 5,837,935 A | * | 11/1998 | Carper et al. | 174/52.4 |
| 5,919,329 A | | 7/1999 | Banks et al. | |
| 6,194,789 B1 | | 2/2001 | Zhou | |
| 6,225,145 B1 | * | 5/2001 | Choi et al. | 438/120 |
| 6,232,150 B1 | | 5/2001 | Lin et al. | |
| 6,400,009 B1 | * | 6/2002 | Bishop et al. | 257/704 |
| 6,436,853 B2 | | 8/2002 | Lin et al. | |
| 6,441,481 B1 | * | 8/2002 | Karpman | 257/711 |
| 6,454,160 B2 | * | 9/2002 | Gueissaz | 228/256 |

(Continued)

FOREIGN PATENT DOCUMENTS

WO  WO 96/30942  10/1996

OTHER PUBLICATIONS

Campbell, Stephen A., "The Science and Engineering of Microelectronic Fabrication," 1996, Oxford University Press, p. 289-291.*

(Continued)

*Primary Examiner*—Douglas M Menz
*Assistant Examiner*—Steven J Fulk

(57) ABSTRACT

This invention provides a system and method for hermetically sealing a post media-filled package with a metal cap. The method can include the operation of filling a MEMS package through a fill port with at least one medium. A further operation can be plugging the fill port in the MEMS package with a sealant. Another operation can include depositing a metal cap over the sealant to hermetically seal the fill port.

14 Claims, 3 Drawing Sheets

U.S. PATENT DOCUMENTS

| | | | |
|---|---|---|---|
| 6,470,594 B1 * | 10/2002 | Boroson et al. | 34/335 |
| 6,481,570 B1 | 11/2002 | Henshall et al. | |
| 6,518,600 B1 * | 2/2003 | Shaddock | 257/98 |
| 6,611,098 B2 | 8/2003 | Mori et al. | |
| 6,627,814 B1 * | 9/2003 | Stark | 174/52.3 |
| 6,635,509 B1 * | 10/2003 | Ouellet | 438/106 |
| 6,740,544 B2 * | 5/2004 | Strouse et al. | 438/118 |
| 6,772,512 B2 | 8/2004 | Tsai et al. | |
| 6,800,373 B2 * | 10/2004 | Gorczyca | 428/447 |
| 6,806,993 B1 * | 10/2004 | Adams et al. | 359/291 |
| 6,930,367 B2 * | 8/2005 | Lutz et al. | 257/417 |
| 7,276,398 B2 * | 10/2007 | Michael et al. | 438/124 |
| 2001/0021570 A1 | 9/2001 | Lin et al. | |
| 2002/0000649 A1 * | 1/2002 | Tilmans et al. | 257/678 |
| 2002/0089044 A1 * | 7/2002 | Simmons et al. | 257/668 |
| 2002/0113296 A1 * | 8/2002 | Cho et al. | 257/659 |
| 2002/0179921 A1 * | 12/2002 | Cohn | 257/99 |
| 2002/0185737 A1 | 12/2002 | Regan et al. | |
| 2003/0010808 A1 | 1/2003 | Uhland et al. | |
| 2003/0011450 A1 * | 1/2003 | Shen et al. | 335/78 |
| 2003/0020401 A1 * | 1/2003 | Park et al. | 313/512 |
| 2003/0038327 A1 * | 2/2003 | Smith | 257/415 |
| 2003/0188881 A1 | 10/2003 | Stark | |
| 2005/0077612 A1 * | 4/2005 | Nikkel et al. | 257/704 |
| 2005/0095833 A1 * | 5/2005 | Lutz et al. | 438/597 |

OTHER PUBLICATIONS

S. Campbell, "The Science and Engineering of Microelectronic Fabrication," 1996, Oxford University Press, pp. 283-306.*

* cited by examiner

METHODS FOR HERMETIC SEALING OF POST MEDIA-FILLED MEMS PACKAGE

This application is a divisional of Ser. No. 10/783,849, filed Feb. 19, 2004, now U.S. Pat. No. 6,946,728 which is hereby incorporated by reference.

FIELD OF THE INVENTION

The present invention relates generally to the sealing of electronic packages. In particular, the present invention relates to hermetic sealing of post media-filled micro-electro-mechanical systems.

BACKGROUND

Packaging of micro-electro-mechanical systems (MEMS) is a complex and costly process. Unlike integrated circuits, which can be packaged in high volumes at costs of less than a penny per chip, packaging a MEMS device can cost in excess of 70% of the overall manufacturing cost. One reason for the complexity of packaging a MEMS device is the varying shape, size, and functionality of each device. A single package may contain a variety of technologies: optics, electronics, motion, chemistry, biology, and so forth. This diversity in technologies places extra demands on the packaging and sealing requirements. Each of the devices interacts with the environment in its own unique way. For example, one MEMS gyroscope may require a vacuum package to operate efficiently, while a different gyro device may require a special pressurized buffer gas atmosphere.

Physical limitations of the MEMS device in the package can limit the types of methods used to seal a MEMS package. Biological or chemical MEMS devices may involve fluids or gasses flowing through a MEMS device, requiring the MEMS package to have inputs, outputs, and possibly be open to the surrounding environment. Optical MEMS devices may require an open air package, or a translucent package that allows light to be transmitted to and from the device. Many MEMS devices include moving parts, thus requiring that the device have sufficient space within any packaging for the parts to move. Various media may be injected into the MEMS package before sealing. In order to keep the media in the package over a long period of time, hermetic sealing may be necessary.

Various methods are currently used to hermetically seal MEMS device packages. One method for hermetic sealing is selective induction heating and bonding, in which electrical currents are passed through the package at selected locations to heat the package locally to temperatures of over two thousand degrees. Although a large amount of this heat can be localized in the package, induction heating can cause a temperature of several hundred degrees at the MEMS device in the package. Depending upon the nature of the MEMS device, a temperature of several hundred degrees may damage the device. The heat can cause different materials used to construct the MEMS device to expand at different rates, placing thermal stress on the device and possibly cracking some materials. Further, the heat can cause expansion of media in the MEMS package causing further damage to the package and the MEMS device.

Ultrasonic bonding for MEMS hermetic packaging can overcome the heating problem caused by selective induction heating. However, the vibrational energy transferred to a MEMS package when using ultrasonic bonding can cause damage to the micro mechanical structures in the device. This is especially true when the MEMS device has multiple moving parts.

SUMMARY OF THE INVENTION

A method is disclosed for hermetically sealing a post media-filled package with a metal cap. The method can include the operation of filling a MEMS package through a fill port with at least one medium. A further operation can be plugging the fill port in the MEMS package with a sealant. Another operation can include depositing a metal cap over the sealant to hermetically seal the fill port.

DETAILED DESCRIPTION

Figure 1:
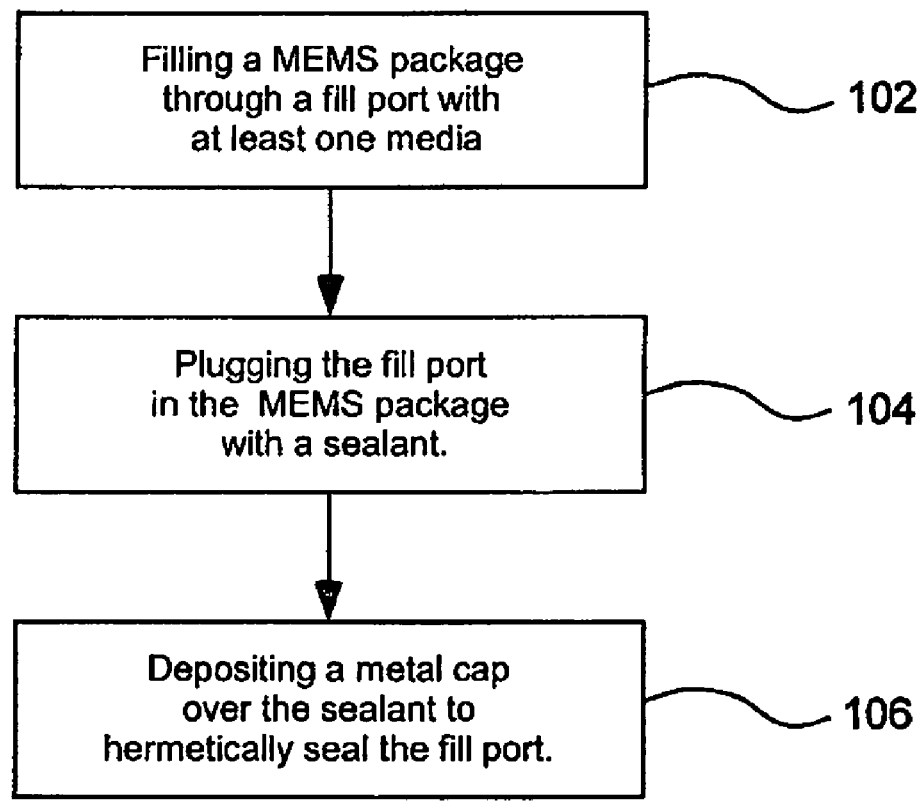
FIG. 1 is a flow chart depicting a method for hermetically sealing a post media-filled MEMS package with a metal cap in accordance with an embodiment of the present invention.
Figure 2A:
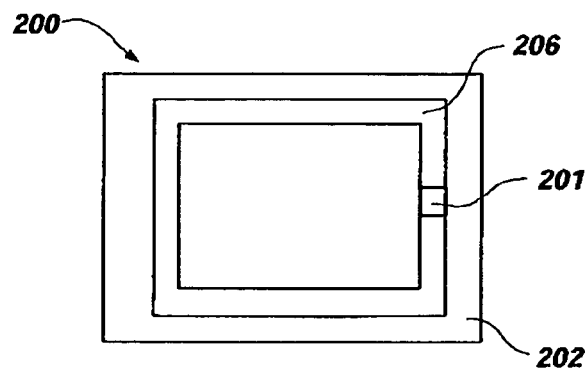
FIGS. 2A-D are diagrams showing a system for hermetically sealing a break in a bond ring of a post media-filled MEMS package with a metal cap in accordance with an embodiment of the present invention.
Figure 2B:
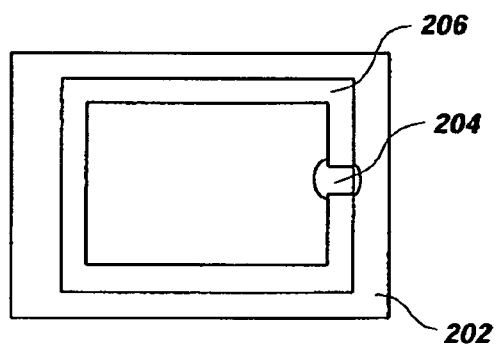
Figure 2C:
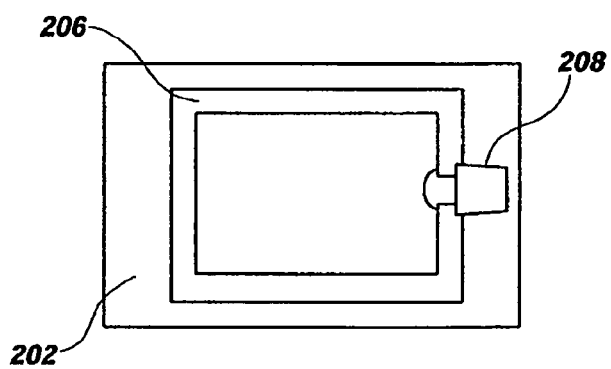
Figure 2D:
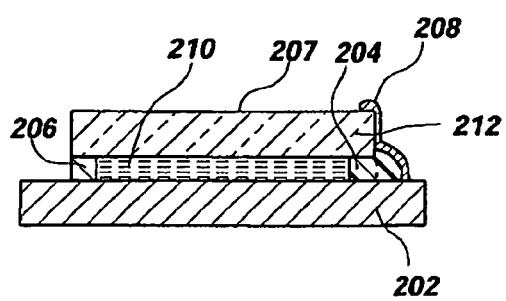
Figure 3A:
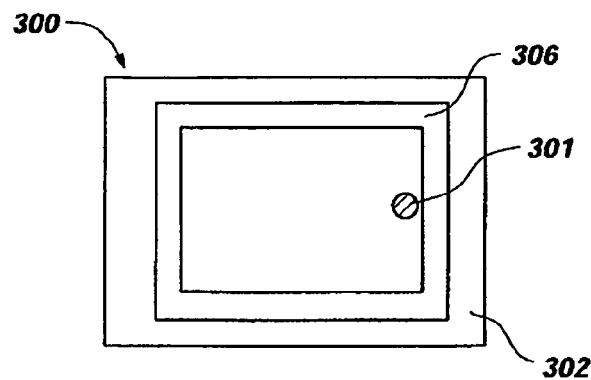
FIGS. 3A-D are diagrams showing a system for hermetically sealing a fill port that is a through-hole in a lid of a post media-filled MEMS package with a metal cap in accordance with an embodiment of the present invention.
Figure 3B:
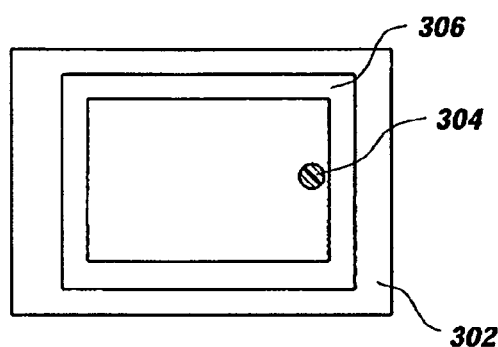
Figure 3C:
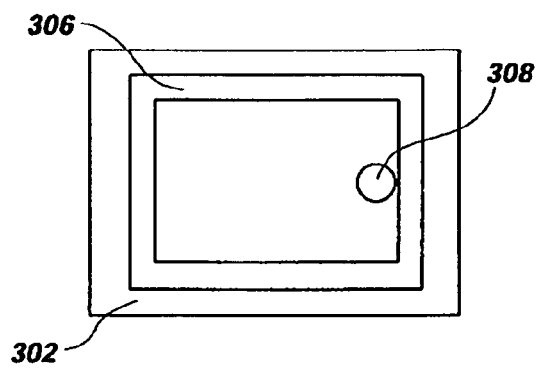
Figure 3D:
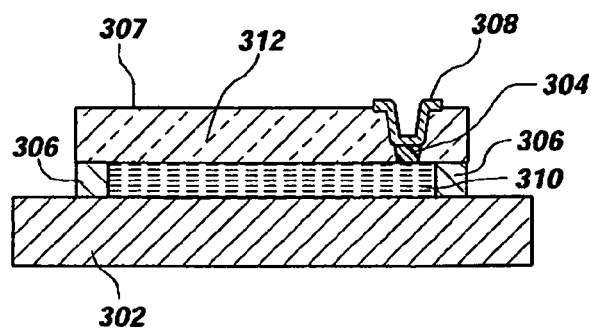

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In order to overcome the problems described above and to provide an efficient system and method for hermetically sealing a MEMS device with minimal heating and vibrational damage, the present invention provides a system and methods for hermetic sealing of a post media-filled package with a metal cap as depicted in FIGS. 1-3. As used herein, "medium" and media refer to a gas, liquid or solid placed within the MEMS package or a vacuum created within the MEMS package in which substantially all of the atmosphere is evacuated from within the MEMS package.

The MEMS device may need a specific type of medium to contribute to and/or counteract heat dissipation, dampening, friction, contamination, oxidation effects, and so forth. One or more mediums can be used to accomplish this, specifically including gasses such as air, nitrogen, oxygen, or argon.

Stiction is another concern that may be resolved through the use of a medium when dealing with the extremely small size and weight of moving parts in a MEMS device. Stiction is the strong interfacial adhesion present between contacting microstructure surfaces. The media used in the MEMS package may be a fluid such as a low vapor pressure oil, a lubricant, or a hydrophobic fluid for use in anti-stiction applications. The fluid can also be selected to have a refractive index similar to that of the glass lid. The fluid may also be chemically altered so that the fluid's coefficient of thermal expansion is similar to that of the MEMS device die and/or package. Matching the fluid's coefficient of thermal expansion can further mitigate thermal expansion and stiction issues.

The media may also include getter material. Getters are materials which, when used in closed containers, reduce the gas or vapor content of the container. Getter material may be used to increase the vacuum in the container, or to help purify an atmosphere within the MEMS package.

The media may also be sol gel. Sol gel is a colloidal suspension of silica particles that is gelled to form a solid. The resulting porous gel can be chemically purified and consolidated at high temperatures into high purity silica.

Referring to FIGS. 2A-D, one embodiment of the present invention involving filling and sealing a MEMS package 200 is shown. The MEMS package 200 may include a MEMS device (not shown) mounted on a substrate 202 within an enclosure 207 with a bond ring 206 surrounding the MEMS device (not shown). The bond ring 206 may have a fill port 201 comprising a break in the bond ring 206. A lid 212 can be disposed above the bond ring 206 and sealed thereto. The bond ring 206 can be used to create a hermetic seal around the MEMS device. At least one medium 210 can be injected into the MEMS package 200 through a fill port 201 that is a break in the bond ring 206. The fill port can then be filled with a sealant 204. The sealant 204 can then be covered with a metal cap 208 to create an enclosure 207 within the MEMS package 200 that is hermetically sealed. The fill port 201 may also include a through-hole located in the MEMS device die (not shown).

Another embodiment of the present invention is shown in FIGS. 3A-D. The MEMS package 300 may include a MEMS device (not shown) mounted on a substrate 302 with a bond ring 306 surrounding the MEMS device. A lid 312 can be disposed above the bond ring 306 to be hermetically sealed thereto. The lid 312 may have a fill port 301 comprising a through hole in the lid 312. The lid may be made of glass or silicone. With the fill port 301 open, an assortment of media 310 can be used to fill the enclosure 307 of the MEMS package, depending upon the needs and structure of the MEMS device, as discussed above. After media fill, the fill port 301 in the lid 312 can be plugged with a sealant 304. The sealant 304 can then be cured and cleaned. A metal cap 308 can then be placed on top of the sealant 304 to create a hermetic seal in an enclosure 307.

Another embodiment of the invention provides a method for hermetically sealing a post media-filled micro-electromechanical system (MEMS) as depicted in the flow chart of FIG. 1. By way of example, the system disclosed in FIG. 2 will be referenced in connection with the method shown in FIG. 1. The method includes step 102, which involves filling a MEMS package 200 through a fill port 201 with at least one medium 210. A further operation is plugging the fill port 201 in the post media-filled MEMS package with a sealant 204, as shown in step 104. The sealant 204 may be an organic sealant such as epoxy, silicones, or spin-on polyamides. The epoxy may be a thermal-set epoxy, an ultraviolet set epoxy, or a two-part epoxy. The sealant may also be inorganic. Once the sealant 204 is applied, the MEMS package 200 may need to be heated to cure the sealant 204. However, curing sealants such as epoxy usually requires temperatures in excess of 100 degrees Celsius for a relatively long period of time. Applying high temperatures for a long period of time can cause failure of the MEMS device and adversely affect any media injected into the MEMS package. Therefore, low temperature curing sealants are desirable in many applications to plug the fill port 201. Low temperature sealants include ultraviolet set epoxy and two-part epoxy. Curing may also be accomplished through the use curing agents and accelerators such as ethylene amines and cycloaliphatics and/or a vacuum used to evaporate a substantial portion of the solvents from the sealant 204. The MEMS package 200 can then be cleaned of any unneeded sealant. Due to the nature of low temperature sealants, the MEMS package 200 is not hermetic at this point since all low temperature sealants leak to some extent and can also be permeable to moisture.

Another operation is depositing a metal cap 208 over the sealant, as shown in step 106. The metal cap 208 can be deposited such that the edges of the metal cap 208 extend beyond the adhesive and adhere entirely to the substrate 202. The substrate 202 and metal cap 208 can be joined through a molecular level bond and/or a mechanical bond created due to surface roughness. The bonding of the metal cap 208 to the substrate 202 can provide a hermetic seal.

The metal cap 208 may be a metal film deposited on top of the sealant 204 and substrate 202 through a shadow mask (not shown). A shadow mask is a metal plate with one or more holes in it that focuses an electron beam. The electron beam can be used to deposit the metal film in the areas in which the electron beam passes through the one or more holes in the metal plate. The one or more holes in the metal plate define a specific pattern in which the metal film will be deposited. A physical vapor deposition tool may also be used to deposit the metal film through a shadow mask. Thus, a shadow mask can be used to form a metal film in a specific pattern or area over the sealant 204 and a small portion of the substrate 202. The metal cap 208 may be formed using specific metals such as gold, titanium, silver, aluminum, chromium, tantalum, or compounds containing such metals. Covering the sealant 204 and a small portion of the substrate 202 with a metal cap 208 can create a hermetic seal, impermeable to gas and liquids. Thus, the MEMS device (not shown) within the enclosure 207 of the MEMS package 200 can be kept in a sustained environment that is best suited to the MEMS device.

The method herein described overcomes the problems of the prior art and provides an efficient method for hermetically sealing a MEMS device with minimal heating and vibrational damage. The present invention provides several advantages over the prior art. The method is an economical method for quickly packaging and hermetically sealing a MEMS device, while still allowing the device to function properly. The method uses a low temperature process that will not cause thermal damage to the MEMS device. The system and method in the present invention is faster and more economical than the methods used in the prior art.

What is claimed is:

1. A method for hermetically sealing a post media-filled micro-electro-mechanical system (MEMS) package, comprising the steps of:
   filling a MEMS package through a fill port with at least one liquid medium;
   plugging the fill port in the MEMS package containing the at least one liquid medium with a sealant; and
   depositing a metal cap in a specific pattern over the sealant to hermetically seal the fill port, wherein the metal cap is deposited through a shadow mask defining a specific pattern, at least a portion of the metal cap extending into the fill port, including depositing a metal film in a specific pattern on top of the sealant using physical vapor deposition through the shadow mask.

2. The method of claim 1, wherein the step of filling the MEMS package includes the more specific step of filling the MEMS package through the fill port that is a through hole located in a lid.

3. The method of claim 1, wherein the step of filling a MEMS package includes the more specific step of filling the MEMS package through the fill port that is a break in a bond ring.

4. The method of claim 1, wherein the step of filling a MEMS package includes the more specific step of filling the MEMS package with at least one liquid medium from the group consisting of a low vapor pressure oil, a lubricant, a hydrophobic fluid, and sol gel.

5. The method of claim 1, wherein the step of filling a MEMS package includes the more specific step of evacuating the MEMS package atmosphere to create a vacuum prior to filling the MEMS package with the at least one liquid medium.

6. The method of claim 1, wherein the step of plugging the fill port includes the more specific step of plugging the fill port with an organic sealant.

7. The method of claim 1, wherein the step of plugging the fill port with an organic sealant includes the more specific step of placing one or more sealants within the fill hole, wherein the sealant is an organic sealant selected from the group consisting of thermal-set epoxy, UV curable epoxy, two-part epoxy, silicone, and spin-on polyamides.

8. The method of claim 1, wherein the step of plugging the fill port includes the more specific step of plugging the fill port with an inorganic sealant.

9. The method of claim 1, further comprising the step of curing the sealant used in plugging the fill port.

10. The method of claim 1, wherein the step of curing the sealant includes the more specific step of curing the sealant with a curing agent.

11. The method of claim 1, wherein the step of curing the sealant includes the more specific step of curing the sealant with a curing agent from the group consisting of ethylene amines and cycloaliphatics.

12. The method of claim 1, wherein the step of curing the sealant includes the more specific step of curing the sealant with using a vacuum.

13. The method of claim 1, further comprising the step of cleaning the MEMS package.

14. A method for hermetically sealing a post media-filled micro-electro-mechanical system (MEMS) package, comprising the steps of:
   filling a MEMS package through a fill port with at least one liquid medium;
   plugging the fill port in the MEMS package containing the at least one liquid medium with a sealant; and
   depositing a metal cap in a specific pattern over the sealant to hermetically seal the fill port, wherein the metal cap is deposited through a shadow mask defining a specific pattern, at least a portion of the metal cap extending into the fill port, including depositing a metal film in a specific pattern on top of the sealant using an electron beam through the shadow mask.

* * * * *

UNITED STATES PATENT AND TRADEMARK OFFICE
CERTIFICATE OF CORRECTION

| | | |
|---|---|---|
| PATENT NO. | : 7,534,662 B2 | Page 1 of 1 |
| APPLICATION NO. | : 11/127915 | |
| DATED | : May 19, 2009 | |
| INVENTOR(S) | : Chien-Hua Chen et al. | |

It is certified that error appears in the above-identified patent and that said Letters Patent is hereby corrected as shown below:

In column 5, line 11, in Claim 7, delete "claim 1" and insert -- claim 6 --, therefor.

In column 5, line 23, in Claim 10, delete "claim 1" and insert -- claim 9 --, therefor.

In column 6, line 1, in Claim 11, delete "claim 1" and insert -- claim 9 --, therefor.

In column 6, line 5, in Claim 12, delete "claim 1" and insert -- claim 9 --, therefor.

Signed and Sealed this

Twenty-second Day of September, 2009

David J. Kappos
*Director of the United States Patent and Trademark Office*